United States Patent
Skrzypchak

(10) Patent No.: US 6,583,355 B2
(45) Date of Patent: Jun. 24, 2003

(54) BLADDER INSERT FOR ENCAPSULANT DISPLACEMENT

(75) Inventor: Mark J. Skrzypchak, Pleasant Prarie, WI (US)

(73) Assignee: Bombardier Motor Corporation of America, Grant, FL (US)

( * ) Notice: Subject to any disclaimer, the term of this patent is extended or adjusted under 35 U.S.C. 154(b) by 0 days.

(21) Appl. No.: 10/054,034

(22) Filed: Jan. 22, 2002

(65) Prior Publication Data

US 2002/0056562 A1 May 16, 2002

Related U.S. Application Data

(63) Continuation of application No. 09/604,983, filed on Jun. 28, 2000, now Pat. No. 6,384,332, which is a continuation-in-part of application No. 09/450,602, filed on Nov. 30, 1999, now Pat. No. 6,303,860.

(51) Int. Cl.$^7$ .................................................. H05K 5/06
(52) U.S. Cl. ...................... 174/52.2; 257/669; 257/687; 257/787; 361/752
(58) Field of Search ............................... 174/52.2, 52.4; 257/787, 788, 669, 687; 361/752

(56) References Cited

U.S. PATENT DOCUMENTS 5,346,743 A * 9/1994 Uchida et al. ................ 428/76
5,689,089 A   11/1997 Polak et al.

* cited by examiner

Primary Examiner—Hung V. Ngo
(74) Attorney, Agent, or Firm—Ziolkowski Patent Solutions Group, LLC

(57) ABSTRACT

An encapsulated device and method for making such encapsulated device containing a bladder disposed between a wall of the case and the encapsulant. The bladder defines a space devoid of encapsulant and contains a collapsible insert such as an open cell foam material, thereby allowing the unimpeded thermal expansion of the encapsulant. By reducing thermal expansion stresses on the encapsulated devices, the reliability of the encapsulated device is improved.

48 Claims, 4 Drawing Sheets

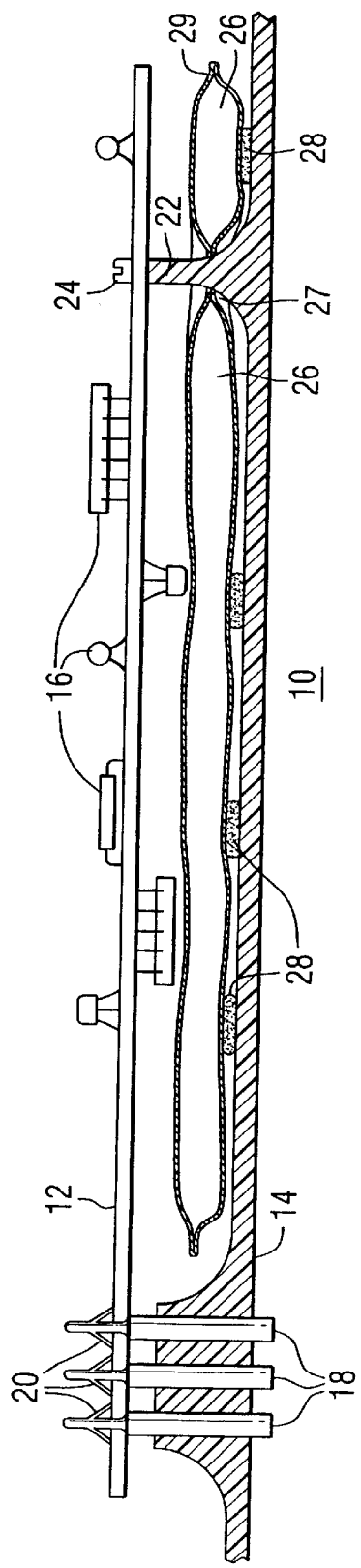
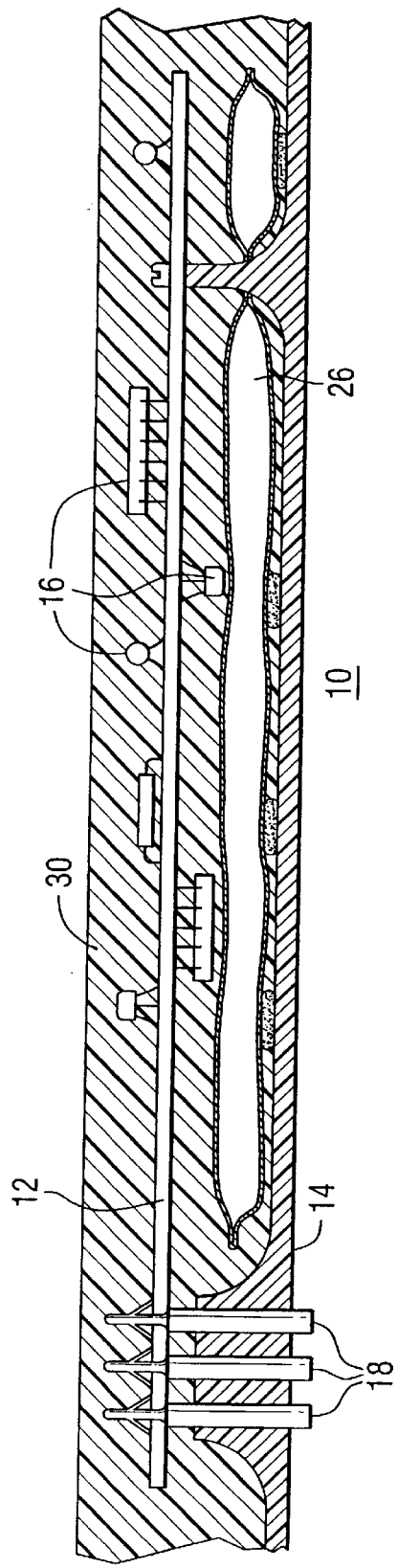
FIG. 1
FIG. 2

BLADDER INSERT FOR ENCAPSULANT DISPLACEMENT

This application is a continuation of Ser. No. 09/604,983 filed Jun. 28, 2000, now U.S. Pat. No. 6,384,332 which is a continuation-in-part of Ser. No. 09/450,602 filed Nov. 30, 1999, now U.S. Pat. No. 6,303,860.

BACKGROUND OF THE INVENTION

This invention relates generally to the field of encapsulated components and to the manufacturing of such components. This invention relates more specifically to the field of electrical components that are encapsulated to improve their resistance to vibration and corrosive environments.

Encapsulation is a process by which a relatively fragile component is surrounded by an encasing material which provides mechanical support to the component and which may seal the component from contact with the ambient environment. Solid state electrical devices are known to be susceptible to printed circuit board failures due to vibration loads and/or mechanical or electrical degradation caused by exposure to a corrosive environment. The assignee of the present invention provides components for the marine environment wherein high levels of vibration and/or corrosive atmospheres may be commonplace. It is known to encapsulate such components to improve their performance in the marine environment. Encapsulants commonly used in such applications include epoxy resin and urethane based products, and they are selected for their workability, mechanical strength and electrical insulating properties. As commonly practiced, the encapsulant is poured in a fluid state into a case containing electrical devices, then allowed to cure to form a solid mass encasing the electrical devices within the case.

While the known process is effective to protect a component against vibration and environmental damage, failures may occur within the component due to mechanical damage caused by the thermal growth characteristics of the encapsulant. For example, it is known that such thermal growth may cause mechanical failure at the point where a conducting pin is soldered directly to a mating connector on a printed circuit board when the pin is fully constrained by being molded into a plastic case. Encapsulant disposed between the printed circuit board and the case is subject to thermal expansion and contraction. The thermal growth of the encapsulant may tend to move the printed circuit board away from the case. However, at the location of the soldered connection, the printed circuit board is maintained at a fixed distance from the case. The thermal expansion of the encapsulant may impose unacceptably high forces on the printed circuit board and/or the soldered connection. Encapsulated electrical components are known to have failed as the result of such differential thermal expansion.

BRIEF SUMMARY OF THE INVENTION

Thus, there is a particular need for an improved method for encapsulating a component to avoid failures resulting from the thermal growth of the encapsulant. There is also a particular need for an encapsulated component having a greater resistance to thermal growth failures.

Described herein is a method for encapsulating components within a case, the method comprising the steps of: forming a bladder having an interior containing a collapsible insert; positioning the bladder within the case; installing at least one component within a case; depositing an encapsulant in a fluid state within the case and allowing the encapsulant to transform to a solid state; and providing a vent connection to the bladder interior so that the collapsible insert may compress and expand as the solid encapsulant expands and contracts. A product formed by such a process is also described herein, as well as a kit to be used for encapsulating a component by the described process.

BRIEF DESCRIPTION OF THE DRAWINGS

The features and advantages of the present invention will become apparent from the following detailed description of the invention when read with the accompanying drawings in which:

FIG. 1 is a partial sectional view of a printed circuit board mounted within a case proximate an inflated bladder.

FIG. 2 is a partial sectional view of the apparatus of FIG. 1 after being encased within an encapsulant.

Similar or identical components illustrated on successive drawings are identified with the same numeral in each drawing.

DETAILED DESCRIPTION OF THE INVENTION

Figure 3:
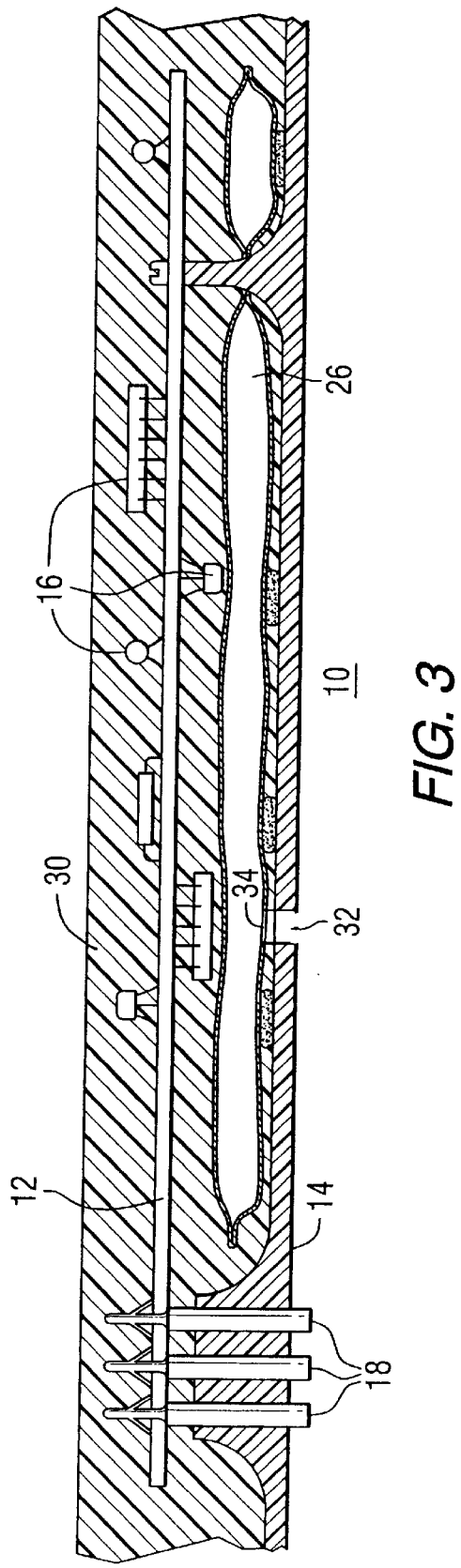
FIG. 3 is a partial sectional view of the apparatus of FIG. 2 wherein the bladder has been punctured by drilling a hole through the case.

The applicants have discovered a method and apparatus for accommodating the thermal growth of an encapsulant disposed within a case. In the embodiment illustrated in FIGS. 1–3 an electrical printed circuit board is encapsulated within a case. The apparatus 10 includes a printed circuit board 12 housed within a case 14. As is known in the art, case 14 may be a one piece injection molded plastic component or a metal component, a partial bottom wall of which is illustrated in FIG. 1. A plurality of electrical devices 16 are mounted to printed circuit board 12. The electrical devices 16 may constitute all or part of a circuit, such as for example, circuitry necessary to perform the function of a power supply. Electrical connection to the circuit board 12 is provided by one or more conductive pins 18. The pins 18 may be sealed within the wall of the case 14 as is known in the art of injection molding. Each pin is illustrated as being soldered to a connector 20 mounted on circuit board 12, thereby providing both mechanical and electrical connections between the case 14 and the circuit board 12. Circuit board 12 may also be supported mechanically by post 22 formed as an integral portion of the wall of case 14. A screw 24 is shown attaching the circuit board 12 to post 22. The circuit board 12 may also be secured directly to the case 14 by a screw or clamp, or may be secured by the action of a connector attached to the case.

Figure 4:
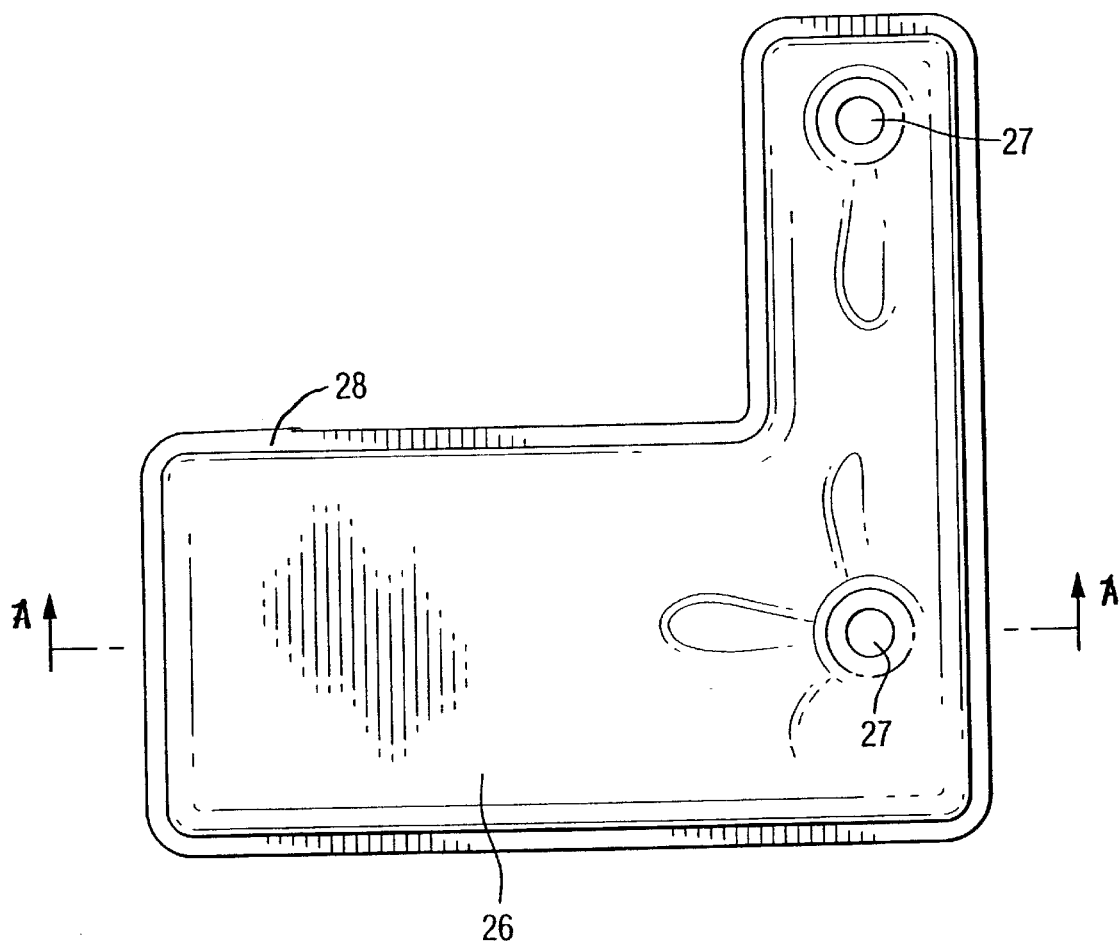
FIG. 4 is a top view of the bladder of FIGS. 1–3.

A bladder 26 is positioned within the case 14, and may be attached to a surface of the case by an adhesive 28. Bladder 26 is a hollow structure defined by a flexible wall member which takes a predetermined shape when inflated to an internal pressure that is higher than the ambient external pressure. The bladder may be formed of a flexible, airtight material, such as polyvinylchloride (PVC). Other materials of construction for the bladder 26 may be selected for ease of manufacturing, electrical insulation properties, resistance to heat, and/or compatibility with the encapsulant material to be used. In the embodiment of FIG. 1, bladder 26 consists of two layers of PVC material sealed on their respective edges 28 by a thermal sealing process. Bladder 26 is also illustrated as having a sealed hole 27 formed in one location for fitting around post 22. Such a hole 27 may be seen more clearly in FIG. 4 which is a top view of bladder 26. FIG. 4 also illustrates the location of a section A—A which is the sectional view of the bladder 26 seen in FIGS. 1–3. Bladder 26 may be formed in any desired shape, and it preferably will conform to the geometry of at least a portion of the interior of case 14. The shape of bladder 26 is selected to match the shape of a desired space within case 14 devoid of encapsulant, as will be described more fully below. The interior of bladder 26 may be filled with air or other fluid so that the bladder takes a predetermined shape when inflated. The bladder 26 may be inflated prior to being installed within the case 14, or for certain applications, it may be installed in a deflated state and inflated once it is in position within the case 14.

FIG. 2 illustrates the apparatus 10 of FIG. 1 after encapsulant 30 has been deposited in the case 14. Prior to depositing the encapsulant 30, the printed circuit board 12, electrical devices 16 and case 14 may be preheated to a predetermined elevated temperature, such as about 85 degrees Centigrade, for a period of time sufficient to remove moisture from the components including the printed circuit board 12. Encapsulant 30 in a fluid state is then poured into the case 14 to a predetermined level. In certain embodiments, it may be necessary to tilt the case 14 and enclosed components while introducing the encapsulant 30 in order to avoid the entrapment of air under the circuit board 12, thereby ensuring the complete encapsulation of all of the devices 16. In the embodiment of FIGS. 1–3, bladder 26 is positioned so that it does not contact any portion of the printed circuit board 12. This insures that the encapsulant 30 will fully encase the electrical devices 16 located on the side of the circuit board 12 proximate the bladder 26. Encapsulant 30 is allowed to cure to transform to a solid state with the bladder 26 in its inflated condition, thereby forming a space devoid of encapsulant 30 at a desired location within the case 14.

FIG. 3 illustrates the apparatus 10 of FIGS. 1–2 with a hole 32 having been drilled through case 14, thereby causing a puncture 34 in bladder 26. The puncture 34 allows the interior of bladder 26 to be in fluid communication with and at pressure equilibrium with the ambient environment of the apparatus 10. As encapsulant 30 grows due to an increase in temperature, the space defined by the bladder 26 which is devoid of encapsulant 30 may decrease to accommodate the thermal expansion of the encapsulant 30. Without the puncture 34, the deformation of encapsulant 30 and resulting decrease in volume of the space devoid of encapsulant may result in an undesirable increase in pressure in bladder 26, thereby negating the desired affect of providing space for the unimpeded thermal growth of encapsulant 30. Because the encapsulant 30 is free to grow into the space defined by bladder 26, the stresses generated in the printed circuit board and attached structures are reduced. The material of bladder 26 is selected so that it remains flexible during the operation of the apparatus 10 and so that it may remain within the apparatus 10 throughout its operating life without detrimental effect.

In lieu of drilling a hole 32 or otherwise penetrating the case 14 in order to form puncture 34, the puncture 34 may be formed by cutting off a portion of bladder 6 extending above the top level of encapsulant 30. Alternatively, a valve may be attached to the wall of bladder 26 and made accessible outside the area of the encapsulant 30. Once the encapsulant 30 has transformed to a solid state, the valve may be opened to provide a fluid communication path between the interior of the bladder 26 and the ambient environment.

The bladder 26 and encapsulant 30 may be supplied together with a fully assembled apparatus 10, or they may be supplied separately as a kit for installation subsequent to the assembly of the circuit board 12 and case 14. Such a kit may include a bladder 26 shaped to fit within the case 14, along with a supply of encapsulant 30. The kit may also include a supply of adhesive 28, such as a tube of liquid adhesive, for securing the bladder 26 in its proper position while the encapsulant 30 is poured into case 14.

Figure 5:
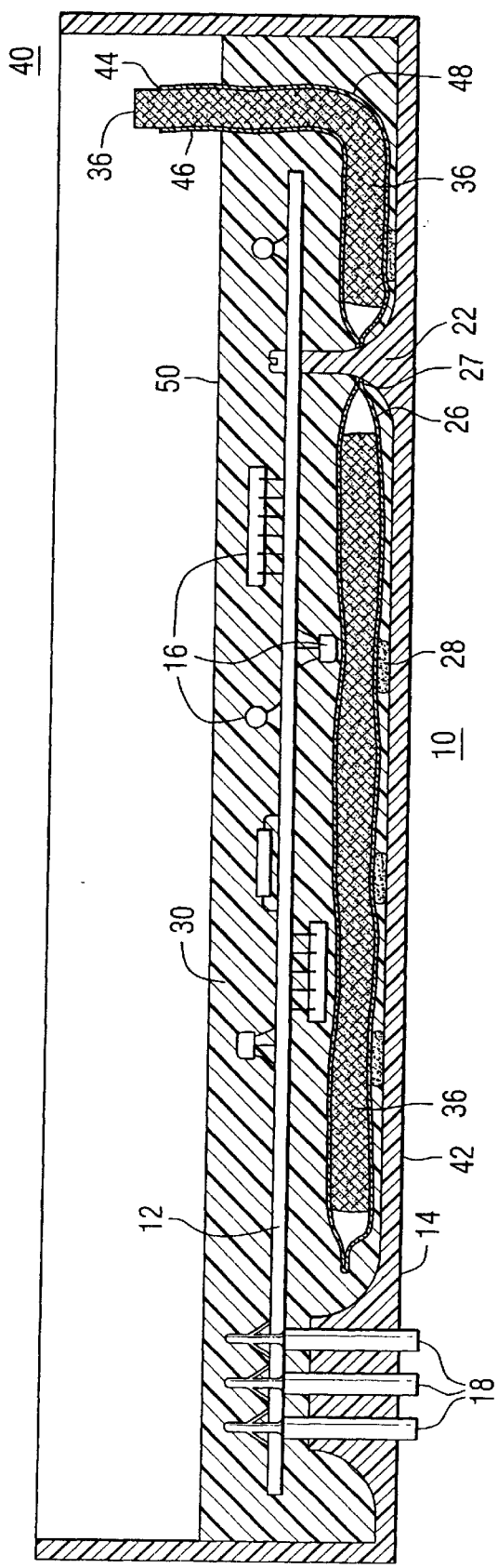
FIG. 5 is a partial sectional view of a printed circuit board mounted within a case above a bladder containing a collapsible insert and having a chimney portion extending above the level of the encapsulant for venting the interior of the bladder.

FIG. 5 illustrates a cross-sectional view of an engine controller 40 for a marine propulsion apparatus wherein a bladder 26 is formed to contain a collapsible insert 36. Circuit board 12 supports and interconnects a plurality of electrical devices 16 functional as part of a control system for a marine engine (not shown). The type, quantity and interconnection of such electrical devices 16 necessary to achieve such functionality are well known in the art and may take any of many embodiments. Bladder 26 is positioned within case 14 proximate the bottom 42 of the case 14 and may be affixed in its location by an adhesive 28. Bladder 26 is positioned between the circuit board 12 and the case 14 to define a space devoid of encapsulant 30. In this embodiment, there is no need to inflate bladder 26 since the collapsible insert 36 acts to maintain the bladder in an expanded condition during the pouring of the liquid encapsulant 30 into the case 14.

Flexible insert 36 may be a material having a resistance to crushing sufficient to support bladder 26 in an expanded condition during the pouring of encapsulant 30 against the bladder 26, and a compressibility sufficient to allow for the expansion and contraction of encapsulant 30 after it has hardened. In one embodiment, insert 36 is a section of 2-pound open cell polyester foam, such as is provided by Federal Foam Technologies, Inc. of New Richmond, Wis. The thickness of the insert 36 may be selected as a function of the expected expansion and contraction of the encapsulant 30 over the expected temperature range, and as a function of the allowable deflection in the circuit board 12 that may be caused by such expansion and contraction. In one embodiment a ¼ inch thick insert was used to create a space devoid of encapsulant that otherwise would have been ¾ inch thick had it been completely filled with encapsulant.

Bladder 26 is formed to have an opening 44, and an end of insert 36 may extend therefrom. Opening 44 functions as a vent to allow air to flow out of and into the bladder 26 as the encapsulant 30 expands and contracts during temperature changes. The opening 44 may be formed to be part of a chimney portion 46 of the bladder 26. The chimney portion 46 extends upward away from the bottom 36 of case 14 from a bend 48 to the vent opening 44 located above a top level 50 of encapsulant 30. Opening 44 may be formed in the bladder 26 during its original construction by removing a sealed edge portion of the chimney 46 or by not sealing a portion of the perimeter of the bladder 26. It is important that the collapsible insert be free to expand the bladder 26 to an expanded condition prior to the step of pouring the liquid encapsulant 30 into the case 14. One method of manufacturing the bladder 26 is to sandwich a layer of open foam material between two layers of PVC material and to sonically seal weld the edges of the PVC material together. The edges of the foam material are spaced away from the edges of the PVC material to be welded in order to ensure that a good seal is created. The bladder may be pressed flat during the welding process to improve the quality control of the welding process. Unless there is a path for air to enter the bladder after the welding process, the two layers of PVC material will remain in a collapsed state. In this case, it is important for the vent opening 44 to be formed prior to the step of pouring the liquid encapsulant 30 into the case 14 in order to ensure that the collapsible insert 26 can expand the bladder 26. Preferably, insert 36 extends through bend 48 to prevent the bladder sides from collapsing and creating a seal preventing the flow of air into and out of the interior of the bladder 26. This is particularly important when the bladder will be exposed to an elevated temperature in order to remove moisture before the encapsulation process, since the elevated temperature may act to cause a welding of the opposed sides of the bladder within the bend 48.

It is possible to use the embodiment of FIG. 5 without a separate bladder material and with only the collapsible insert 36 defining the space devoid of encapsulant. The selection of materials for such an application must consider any possible flow of the encapsulant 30 into the collapsible insert 36 prior to the hardening of the encapsulant 30. For example, if an open cell foam material is used for the insert 36, the size and material of the cells and the viscosity of the liquid encapsulant will determine the rate of flow of the encapsulant into the cells. Any such migration of encapsulant prior to its solidification would, of course, decrease the compressibility of the insert 36 and should be accounted for in the selection of the thickness of the insert. It is also possible to cover the insert 36 with a barrier material that is impervious to the liquid encapsulant to prevent this undesirable migration of encapsulant into the insert 26. Such barrier materials may include, for example, a PVC plastic or a common kitchen cooking wrap. One or both sides of the insert 36 may need to be covered, depending upon the specific application. Federal Foam Technologies, Inc. of New Richmond, Wis. provides an open cell foam product laminated with a flexible polyester film that may be useful in such applications.

While the preferred embodiments of the present invention have been shown and described herein, such embodiments are provided by way of example only. Numerous variations, changes and substitutions will occur to those of skill in the art without departing from the invention herein. For example, the embodiment illustrated in FIGS. 1–3 is for an electrical printed circuit board component. Other embodiments may include, for example, discreet electrical components, mechanical devices, sensors, or fragile containers, etc. mounted in a case. Accordingly, it is intended that the invention be limited only by the spirit and scope of the appended claims.

I claim:

1. A method of encapsulating components within a case, the method comprising the steps of:
    forming a bladder having an interior containing a collapsible insert;
    positioning the bladder within a case;
    installing at least one component within the case; and
    depositing an encapsulant in a fluid state within the case and allowing the encapsulant to transform to a solid state with the bladder forming a space devoid of Encapsulant.

2. The method of claim 1, wherein the step of positioning further comprises attaching the bladder to a surface of the case.

3. The method of claim 1, wherein the step of positioning further comprises positioning the bladder not to contact any portion of the at least one component.

4. The method of claim 1, further comprising:
    attaching the bladder to a bottom surface of the case;
    mounting a circuit board in the case above the bladder; and
    tilting the case while pouring the encapsulant into the case to ensure that the encapsulant flows between the bladder and the circuit board.

5. The method of claim 1, further comprising the steps of forming the bladder to have the space form a fixed shape and positioning the bladder in a predetermined location within the case so that a space devoid of encapsulant created by the bladder has a predetermined shape and location relative to the case and the at least one component.

6. The method of claim 1, further comprising the steps of heating the at least one component, bladder and case to remove moisture prior to the step of depositing an encapsulant.

7. The method of claim 1, wherein the step of forming a bladder having an interior containing a collapsible insert comprises the steps of:
    providing an open cell foam material;
    providing a layer of plastic material on each of opposed sides of the open cell foam material; and
    sealing respective mating edges of the plastic material around a perimeter of the open cell foam material.

8. The method of claim 7, wherein the step of providing a vent connection comprises removing a portion of the sealed mating edges.

9. A product by the process of:
    forming a bladder having an interior containing an insert;
    positioning the bladder within a case;
    installing at least one component within the case; and
    depositing an encapsulant in a fluid state within the case and allowing the encapsulant to transform to a solid state with the bladder forming a space devoid of encapsulant.

10. The product of claim 9, formed by the further step of attaching the bladder to a surface of the case.

11. The product of claim 9, formed by the further step of positioning the bladder not to contact any portion of the at least one component.

12. The product of claim 9, formed by the further steps of:
    attaching the bladder to a bottom surface of the case;
    mounting a circuit board in the case above the bladder;
    tilting the case while pouring the encapsulant into the case to ensure that the encapsulant flows between the bladder and the circuit board.

13. The product of claim 9, formed by the further steps of forming the bladder to have the space have a fixed shape and positioning the bladder in a predetermined location within the case so that a space devoid of encapsulant created by the bladder has a predetermined shape and location relative to the case and the at least one component.

14. The product of claim 9, formed by the further steps of heating the at least one component, bladder and case to remove moisture prior to the step of depositing an encapsulant.

15. The product of claim 9, wherein the step of forming a bladder having an interior containing a collapsible insert comprises the steps of:
    providing an open cell foam material;
    providing a layer of plastic material on each of opposed sides of the open cell foam material; and
    sealing respective mating edges of the plastic material around a perimeter of the open cell foam material.

16. The product of claim 15, formed by the further step of removing a portion of the sealed mating edges to provide a vent connection.

17. An apparatus comprising:
a case;
an electrical component disposed within the case;
encapsulate disposed within the case and in contact with at least one surface of the electrical component;
a bladder disposed within the case; and
an insert disposed within the bladder.

18. The apparatus of claim 17, wherein an interior of the bladder is in fluid communication with an ambient environment of the apparatus.

19. The apparatus of claim 17, further comprising a puncture in the bladder.

20. The apparatus of claim 17, further comprising a hole in the case proximate the puncture.

21. The apparatus of claim 17, wherein the bladder comprises a PVC material.

22. The apparatus of claim 17, wherein the collapsible insert comprises an open cell foam material.

23. The apparatus of claim 17 wherein the bladder forms a space devoid of encapsulant.

24. The apparatus of claim 23, wherein the space is a fixed volume.

25. The apparatus of claim 24, wherein the insert defines the space.

26. A kit for encapsulating a component within a case, the kit comprising:
a bladder shaped to fit within a case proximate a component;
an insert disposed within the bladder; and
encapsulant for at least partially filling the interior of the case to be in contact with the component and the bladder.

27. The kit of claim 26, wherein the bladder comprises a PVC material.

28. The kit of claim 26, wherein the insert comprises an open cell foam material.

29. The kit of claim 26, further comprising an adhesive for attaching the bladder to a wall of the case.

30. An apparatus comprising:
a case;
an electrical component disposed within the case;
encapsulate disposed within the case and in contact with at least one surface of the electrical component;
an insert defining a space devoid of encapsulant disposed within the case.

31. The apparatus of claim 30, wherein the insert comprises an open cell foam material.

32. The apparatus of claim 31, further comprising a layer of material impervious to the encapsulant disposed between the encapsulant and the open cell foam material.

33. The apparatus of claim 30, wherein the insert comprises a bladder containing an open cell foam material and having a vent connection.

34. An apparatus comprising:
a case;
an electrical component disposed within the case;
encapsulate disposed within the case to a level covering the electrical component;
a bladder having a first portion disposed within the case and a chimney portion extending above the level of the encapsulant; and
an insert disposed in the bladder.

35. The apparatus of claim 34, wherein the insert is an open cell foam material extends from the first portion through the bend to a chimney portion.

36. An engine controller for a marine propulsion apparatus comprising:
a case;
a circuit board attached to the case at a predetermined height above a bottom of the case;
encapsulate disposed within the case to a level covering the circuit board; and
a bladder disposed between the bottom of the case and the circuit board and defining a space devoid of encapsulant, the bladder containing an insert.

37. The engine controller of claim 36, wherein the insert comprises an open cell foam material.

38. The engine controller of claim 37, further comprising:
a bend formed in the bladder to define an end of a chimney portion; and
wherein the open cell foam material extending through the bend.

39. A method of manufacturing an electrical component, the method comprising the steps of:
providing a case;
positioning a bladder containing an insert proximate a bottom of the case, the bladder having a chimney portion extending upward away from the bottom of the case;
mounting a circuit board within the case above the bladder, a top of the chimney portion extending above a top of the circuit board;
filling the case with encapsulant to a level above the top of the circuit board but below the top of the chimney portion, the bladder defining a space devoid of encapsulant between the bottom of the case and the circuit board.

40. The method of claim 39, further comprising the step of removing a portion of the top of the chimney portion to provide a vent connection to an interior of the bladder prior to the step of filling the case with encapsulant.

41. The method of claim 39, further comprising forming the bladder containing an insert by the steps of:
providing an open cell foam material;
covering the open cell foam material with a top layer of PVC material and a bottom layer of PVC material; and
sealing respective mating sides of the top layer and the bottom layer of PVC material together around a perimeter of the open cell foam material.

42. The method of claim 39, further comprising the steps of:
positioning the insert to extend into the chimney portion;
forming a bend in the bladder to extend the chimney portion upward away from the bottom of the case, the insert extending through the bend;
heating the case, bladder and circuit board to remove moisture prior to the step of filing the case with encapsulant.

43. A method of manufacturing an electrical apparatus, the method of comprising the steps of:
providing a case;
installing an electrical component within the case;
installing an insert and an electrical component within the case; and introducing encapsulant into the case to cover at least one surface of the electrical component, wherein the insert defining a space devoid of encapsulant within the case.

44. The method of claim 43, further comprising forming the collapsible insert from an open cell foam material.

45. The method of claim 44, further comprising the step of covering at least a portion of the open cell foam material with a layer of material impervious to the encapsulant prior to the step of introducing encapsulant.

46. The method of claim 43, further comprising the steps of:

forming a bladder around the insert prior to the step of installing the insert.

47. The method of claim 46, further comprising the step of forming a vent opening in the bladder.

48. The method of claim 47, further comprising the step of forming a bend in the bladder to position the vent opening above a top level of the encapsulant prior to the step of introducing encapsulant.

* * * * *